(12) United States Patent
Tanzawa

(10) Patent No.: US 9,019,766 B2
(45) Date of Patent: *Apr. 28, 2015

(54) BIASING SYSTEM AND METHOD

(71) Applicant: Micron Technology, Inc., Boise, ID (US)

(72) Inventor: Toru Tanzawa, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/103,560

(22) Filed: Dec. 11, 2013

(65) Prior Publication Data

US 2014/0098611 A1    Apr. 10, 2014

Related U.S. Application Data

(60) Continuation of application No. 13/399,739, filed on Feb. 17, 2012, now Pat. No. 8,611,153, which is a division of application No. 12/114,570, filed on May 2, 2008, now Pat. No. 8,125,829.

(51) Int. Cl.
  *G11C 16/04* (2006.01)
  *G11C 16/30* (2006.01)
  *G11C 16/10* (2006.01)

(52) U.S. Cl.
  CPC ............ *G11C 16/30* (2013.01); *G11C 16/0483* (2013.01); *G11C 16/10* (2013.01)

(58) Field of Classification Search
  USPC .......................... 365/185.13, 185.11, 185.25
  See application file for complete search history.

(56) References Cited

U.S. PATENT DOCUMENTS

| | | |
|---|---|---|
| 5,828,621 A | 10/1998 | Tanzawa et al. |
| 5,856,939 A | 1/1999 | Seyyedy |
| 6,781,915 B2 | 8/2004 | Arimoto et al. |
| 6,813,216 B2 | 11/2004 | Lee |
| 6,934,177 B2 | 8/2005 | Takashima |
| 7,149,115 B2 | 12/2006 | Ogura et al. |
| 7,626,874 B1 | 12/2009 | Fan et al. |
| 8,125,829 B2 * | 2/2012 | Tanzawa .................. 365/185.13 |
| 2003/0022441 A1 | 1/2003 | Ogura et al. |
| 2004/0174728 A1 | 9/2004 | Takano et al. |
| 2006/0018183 A1 | 1/2006 | De Sandre et al. |
| 2006/0044919 A1 | 3/2006 | Taoka et al. |
| 2006/0281260 A1 | 12/2006 | Lue |
| 2007/0008775 A1 | 1/2007 | Telecco et al. |
| 2007/0103994 A1 * | 5/2007 | Ahmed et al. ........... 365/189.11 |
| 2007/0263457 A1 | 11/2007 | Park |
| 2008/0080229 A1 | 4/2008 | Choi et al. |

OTHER PUBLICATIONS

Toru Tanzawa, Tomoharu Tanaka, Ken Takeuchi, and Hiroshi Nakamura; Circuit Techniques for a 1.8-VOnly NAND Flash Memory;0018-9200/0217.00, 2002 IEEE.

* cited by examiner

*Primary Examiner* — Huan Hoang
(74) *Attorney, Agent, or Firm* — Fletcher Yoder, P.C.

(57) ABSTRACT

Embodiments are provided that include a memory system that includes a memory system, having an access device coupled between a global line and a local line and a voltage source coupled to the global line and configured to output a bias voltage on the global line when the memory system is in a non-operation state. The access device is selected when the memory system is in the non-operation state, and the access device is deselected when the memory system is in an other state. Further embodiments provide, for example, a method that includes coupling a global access line to a local access line, biasing the local access line to a voltage other than a negative supply voltage while a memory device is in a first state and uncoupling the global access line from the local access line while the memory device is in an other state.

19 Claims, 14 Drawing Sheets

Table 1 Biasing conditions

| | Standby | Read | Program | Erase |
|---|---|---|---|---|
| BLKEN0 | 2V | 6V | 22V | 6V |
| BLKEN1 | 2V | 0V | 0V | 0V |
| BL0 | 0V | 1V | 2V("1")/0V("0") | Float |
| BL1 | 0V | 0V | 2V | Float |
| SL | 0V | 0V | 0V | Float |
| GSGS | 0.5V | 4V | 0V | Float |
| GWL0 | 0.5V | 4V | 8V | 0V |
| GWL1 | 0.5V | 0V | 18V | 0V |
| GSGD | 0.5V | 4V | 2V | Float |
| SGS0 | 0.5V | 4V | 0V | Float |
| WL00(0) | 0.5V | 4V | 8V | 0V |
| WL0(1) | 0.5V | 0V | 18V | 0V |
| SGD0 | 0.5V | 4V | 2V | Float |
| SGS1 | 0.5V | 0V | 0V | Float |
| WL1(0) | 0.5V | Float | Float | Float |
| WL1(1) | 0.5V | Float | Float | Float |
| SG1 | 0.5V | 0V | 0V | Float |

FIG. 7

Table 2 Biasing conditions

|         | Standby | Active | read  | Program | Erase |
|---------|---------|--------|-------|---------|-------|
| BLKENEN0 | 0V      | 2V     | 6V    | 22V     | 6V    |
| BLKENEN1 | 0V      | 2V     | 0V    | 0V      | 0V    |
| BL0     | 0V      | 0V     | 1V    | 2V      | Float |
| BL1     | 0V      | 0V     | 0V    | 2V      | Float |
| SL      | 0V      | 0V     | 0V    | 0V      | Float |
| GSGS    | 0V      | 0.5V   | 4V    | 0V      | Float |
| GWL0    | 0V      | 0.5V   | 4V    | 8V      | 0V    |
| GWL1    | 0V      | 0.5V   | 0V    | 18V     | 0V    |
| GSGD    | 0V      | 0.5V   | 4V    | 2V      | Float |
| SGS0    | 0V      | 0.5V   | 4V    | 0V      | Float |
| WL0(0)  | Float   | 0.5V   | 4V    | 8V      | 0V    |
| WL0(1)  | Float   | 0.5V   | 0V    | 18V     | 0V    |
| SGD0    | 0V      | 0.5V   | 4V    | 2V      | Float |
| SGS1    | 0V      | 0.5V   | 0V    | 0V      | Float |
| WL1(0)  | Float   | 0.5V   | Float | Float   | Float |
| WL1(1)  | Float   | 0.5V   | Float | Float   | Float |
| SGD1    | 0V      | 0.5V   | 0V    | 0V      | Float |

FIG. 9

Table 3 Biasing conditions

| | Standby | Active | read | Program | Erase |
|---|---|---|---|---|---|
| BLKEN0 | 0V | 2V | 6V | 22V | 6V |
| BLKEN1 | 0V | 2V | 0V | 0V | 0V |
| BL0 | 0V | 0V | 1V | 2V( | Float |
| BL1 | 0V | 0V | 0V | 2V | Float |
| SL | 0V | 0V | 0V | 0V | Float |
| GSGS | 0V | 0.5V | 4V | 0V | Float |
| GWL0 | 0V | 0.5V | 4V | 8V | 0V |
| GWL1 | 0V | 0.5V | 0V | 18V | 0V |
| GSGD | 0V | 0.5V | 4V | 2V | Float |
| SGS0 | 0V | 0.5V | 4V | 0V | Float |
| WL0(0) | Float | 0.5V | 4V | 8V | 0V |
| WL0(1) | Float | 0.5V | 0V | 18V | 0V |
| SGD0 | 0V | 0.5V | 4V | 2V | Float |
| SGS1 | 0V | 0.5V | 0V | 0V | Float |
| WL1(0) | Float | 0.5V | Float | Float | Float |
| WL1(1) | Float | 0.5V | Float | Float | Float |
| SGD1 | 0V | 0.5V | 0V | 0V | Float |

BIASING SYSTEM AND METHOD

CROSS-REFERENCE TO RELATED APPLICATION

This application is a continuation of U.S. patent application Ser. No. 13/399,739, which was filed on Feb. 17, 2012, now U.S. Pat. No. 8,611,153, which issued on Dec. 17, 2013, which is a divisional of U.S. patent application Ser. No. 12/114,570, which was filed on May 2, 2008, now U.S. Pat. No. 8,125,829, which issued Feb. 28, 2012.

BACKGROUND

1. Field of the Invention

Embodiments of the invention relate generally to the field of memory devices and more particularly, to a system and method for biasing lines in semiconductor memories.

2. Description of the Related Art

Flash memory is a non-volatile memory that can be electrically erased and reprogrammed. It is primarily used in memory cards, USB flash drives, and the like, for storage of data in computer systems. Generally, flash memory stores information in an array of floating gate transistors, called "cells", each of which traditionally stores one bit of information that is represented as a "0" or a "1". The memory device often includes a grid-like arrangement of the cells and associated transistors. Each of the cells in the grid consumes a given amount of area and is spaced from one another by a generally uniform distance (e.g., pitch). Accordingly, the size and the pitch of the cells directly contribute to the overall size of the memory device. This becomes more evident as the number of cells and associated storage capacity of memory devices increase.

As technology continues to advance, it is desirable that memory devices decreases in size. Smaller memory devices can be employed in smaller spaces and/or can increase storage capacity in a limited area or volume. One technique for reducing the memory device size typically includes reducing the size (e.g., scaling) of the memory cell and associated transistors. Unfortunately, as the cells and associated transistors are scaled, physical limitations may undesirably reduce the performance of the memory device. For example, the memory cells and associated transistors are scaled, the tunnel oxide thickness in a high-voltage (HV) transistor may become so thin that it cannot reliably hold electrons on the floating gate of the cell. As a result, the cell may not reliably store data over an extended period of time. For example, it will be appreciated that the tunnel oxide thickness of flash memory cells is based on the data retention characteristics and in typically within about 7-10 nm (nano meters). This thickness may be critical, as the cells may have to retain the charges for an extended period (e.g., 10 years). Because programming voltage on word-lines results in such a high voltage (e.g., 15-25V), the gate oxide thickness in the decoding or access transistors may be about 30-40 nm which can limit the decoding or accessing transistor channel length to about 2-3 micro meters (um). Unfortunately, this may limit the reduction of cell and transistor size and, thus, limit scaling of the entire memory device.

Embodiments of the present invention may be directed to one or more of the problems set forth above.

BRIEF DESCRIPTION OF THE DRAWINGS

FIG. 7 is a table that depicts various voltage levels in accordance with one or more embodiments of the present invention;

FIG. 9 is a table that depicts various voltage levels in accordance with other embodiments of the present invention;

FIG. 11 is a table that depicts various voltage levels in accordance with other embodiments of the present invention;

DETAILED DESCRIPTION OF SPECIFIC EMBODIMENTS

As discussed in further detail below, according to at least one embodiment of the present invention, the disclosed systems and methods relate to a biasing scheme for transistors of a memory device. More specifically, some embodiments include biasing local word lines during non-operational states. The biasing scheme in certain embodiments includes biasing a local word line to a voltage level that is not equal to a "negative" voltage supply (e.g., if the access devices connecting a global word line to a local word line are nMOS transistors, then the local word line would be biased above the negative supply voltage level, which is conventionally 0V). The biasing scheme is applied in a non-operation state, such as a stand-by state or active state prior to and/or after certain operation states (e.g., read, program, or erase states) of the memory device. Biasing the local word-line provides a bias voltage level that remains on the word line during the operations of the memory device and may help to reduce the amount of leakage current from the global word line (e.g., across an access transistors). Reducing the leakage current may enable a reduction of the channel length and the gate oxide thickness of the associated transistors and, thereby enable further scaling of memory cells, associated transistors, and the associated memory device.

Figure 1:
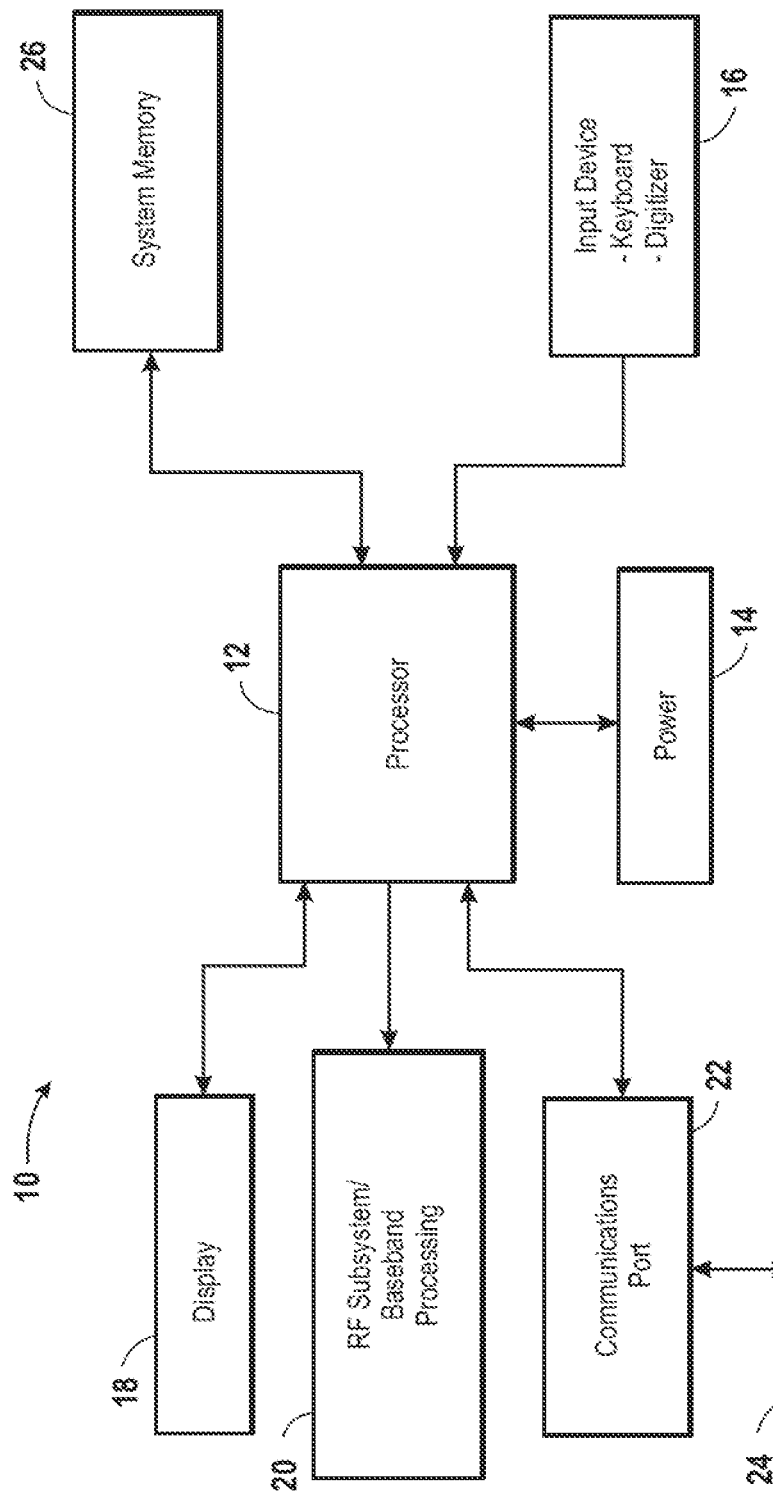
FIG. 1 is a block diagram that illustrates a processor-based device having a memory that includes memory devices fabricated in accordance with one or more embodiments of the present invention.

Turning now to the figures, FIG. 1 includes a block diagram depicting a processor-based system, generally designated by reference numeral 10. The system 10 may be any of a variety of types such as a computer, pager, cellular phone, personal organizer, control circuit, etc. In a typical processor-based device, a processor 12, such as a microprocessor, controls the processing of system functions and requests in the system 10. Further, the processor 12 may comprise a plurality of processors that share system control.

The system 10 typically includes a power supply 14. For instance, if the system 10 is a portable system, the power supply 14 may advantageously include permanent batteries, replaceable batteries, and/or rechargeable batteries. The power supply 14 may also include an AC adapter, so that the system 10 may be plugged into a wall outlet, for instance. The power supply 14 may also include a DC adapter such that the system 10 may be plugged into a vehicle cigarette lighter, for instance.

Various other devices may be coupled to the processor 12 depending on the functions that the system 10 performs. For instance, a user interface 16 may be coupled to the processor 12. The user interface 16 may include buttons, switches, a keyboard, a light pen, a mouse, and/or a voice recognition system, for instance. A display 18 may also be coupled to the processor 12. The display 18 may include an LCD display, a CRT, LEDs, and/or an audio display, for example.

Furthermore, an RF sub-system/baseband processor 20 may also be coupled to the processor 12. The RF sub-system/baseband processor 20 may include an antenna that is coupled to an RF receiver and to an RF transmitter (not shown). A communications port 22 may also be coupled to the processor 12. The communications port 22 may be adapted to be coupled to one or more peripheral devices 24 such as a modem, a printer, a computer, or to a network, such as a local area network, remote area network, intranet, or the Internet, for instance.

Because the processor 12 controls the functioning of the system 10 by implementing software programs, memory is used in conjunction with the processor 12. Generally, the memory is coupled to the processor 12 to store and facilitate execution of various programs. For instance, the processor 12 may be coupled to system memory 26, which may include volatile memory, such as Dynamic Random Access Memory (DRAM) and/or Static Random Access Memory (SRAM). The system memory 26 may also include non-volatile memory, such as read-only memory (ROM), EEPROM, and/or flash memory to be used in conjunction with the volatile memory. As discussed in further detail below, the system memory 26 may include one or more memory devices, such as flash memory devices, that include a floating gate memory array fabricated and implementing techniques in accordance with one or more embodiments of the present invention.

Figure 2:
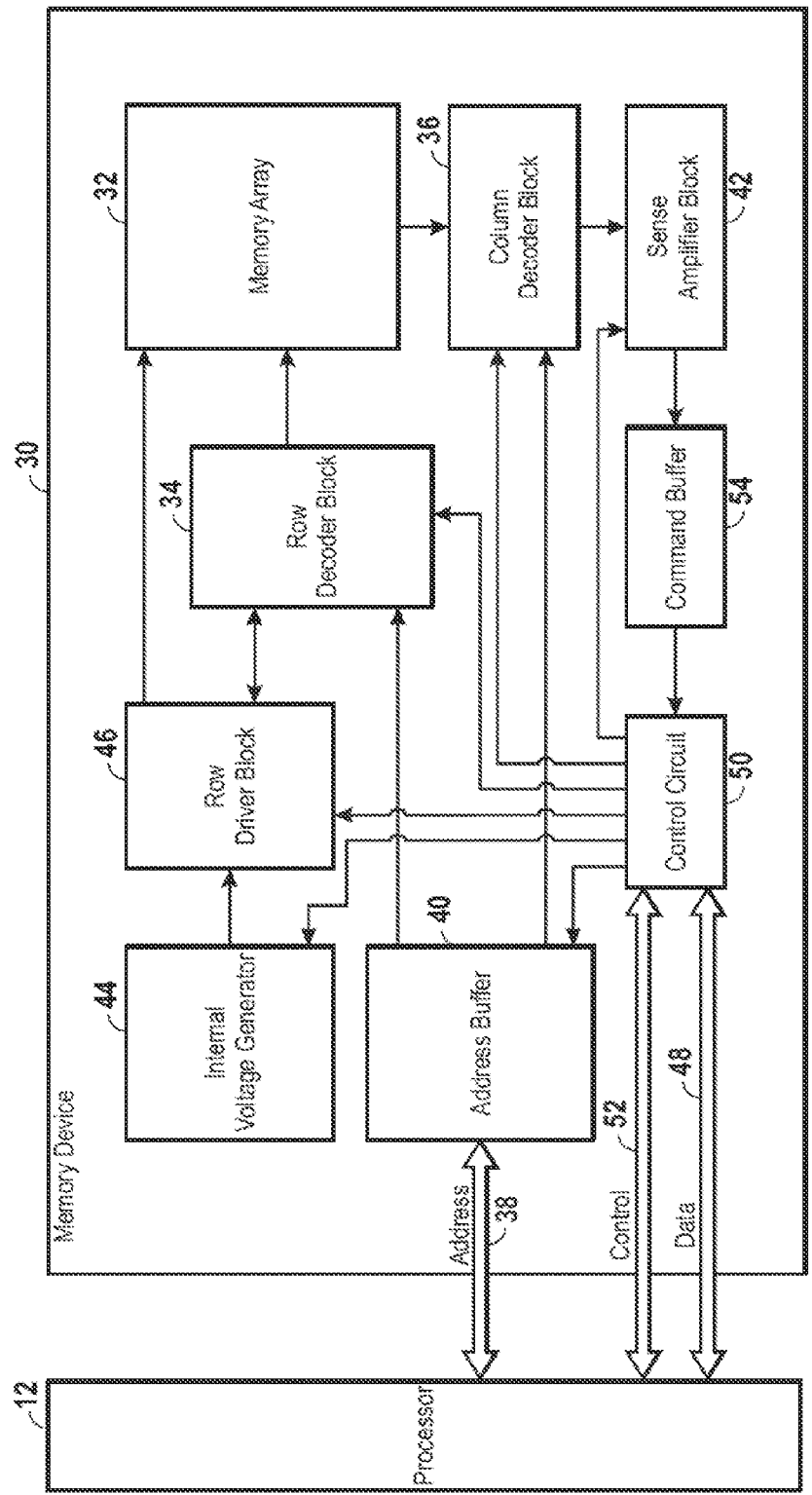
FIG. 2 is a block diagram that illustrates a memory device having a memory array fabricated in accordance with one or more embodiments of the present invention.

FIG. 2 is a block diagram that illustrates a flash memory device 30 that may be included as a portion of the system memory 26 of FIG. 1. As will be discussed in further detail with respect to FIG. 3, the flash memory device 30 may be a NAND flash memory device. The flash memory device 30 generally includes a memory array 32. The memory array 32 generally includes many rows and columns of conductive traces arranged in a grid pattern. "Access lines" are used to access cells and generally correspond to the rows or "row lines" of the memory array 32. In the conventional art, they are generally referred to as "word lines." "Data lines" generally correspond to the columns or "column lines." In the conventional art, they are generally referred to as "digit lines" (e.g., bit lines). The size of the memory array 32 (i.e., the number of memory cells) will vary depending on the size of the flash memory device 30.

To access the memory array 32, a row decoder block 34 and a column decoder block 36 are provided and are configured to receive and translate address information from the processor 12 via the address bus 38 and the address buffer 40 and to access a particular memory cell in the memory array 32. A sense amplifier block 42, having a plurality of the sense amplifiers, is also provided inline with the column decoder 36 and the memory array 32. The sense amplifier block 42 senses and amplifies individual values stored in the memory cells. A row driver block 46 is provided to activate a selected word line in the memory array according to a given row address.

An internal voltage source 44, such as a voltage generator, is provided to deliver voltages for use within the memory device 30. The internal voltage source 44 may provide voltage levels for, program, read, verify, and erase operations. The internal voltage source 44 may include a trimming circuit to accurately regulate the voltage level output by the internal voltage source 44.

During read and program operations, data may be transferred to and from the flash memory device 30 via the data bus 48. The coordination of the data and address information may be conducted through a control circuit 50. The control circuit 50 may be configured to receive control signals from the processor 12 via the control bus 52. A command buffer 54 may be configured to temporarily store commands of the control circuit 50. The control circuit 50 is coupled to each of the row decoder block 34, the column decoder block 36, the address buffer 40, the sense amplifier block 42, the internal voltage generator 44, the row driver block 46, and the command buffer 54, and is generally configured to coordinate timing and control among the various circuits in the flash memory device 30.

Figure 3:
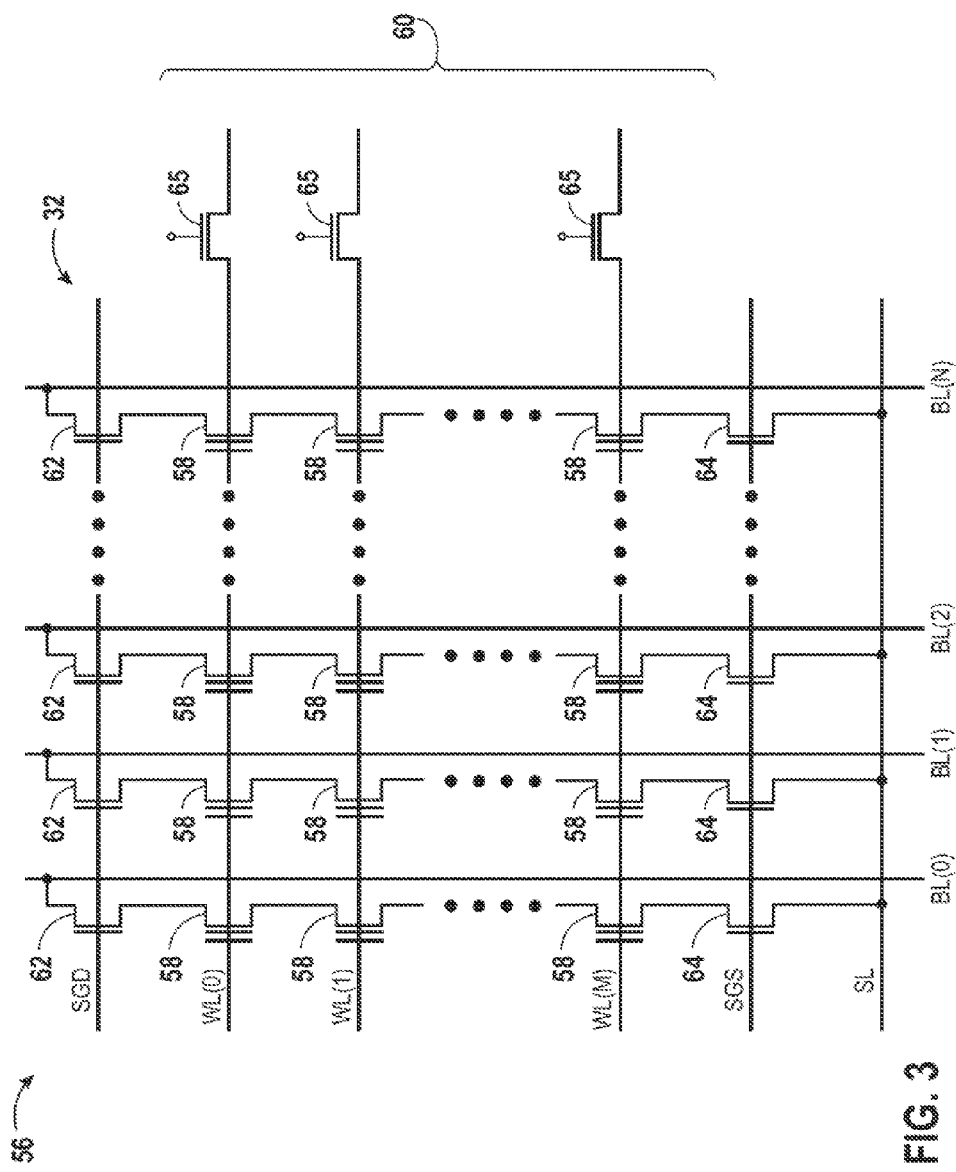
FIG. 3 is a schematic diagram of a NAND flash memory array having memory cells fabricated in accordance with one or more embodiments of the present invention.

FIG. 3 illustrates an embodiment of the memory array 32 of FIG. 2. In the illustrated embodiment, the memory array 32 includes a NAND memory array 56. The NAND memory array 56 includes local word lines WL(0)-WL(M) and intersecting local bit lines BL(0)-BL(N). As will be appreciated, for ease of addressing in the digital environment, the number of local word lines WL and the number of local bit lines BL are each a power of two (e.g., 256 local word lines (WL) by 4,096 bit lines (BL)). The local bit lines BL are coupled to global bit lines (not depicted) in a many-to-one relationship.

The NAND memory array 56 includes a floating gate transistor 58 located at each intersection of a local word line (WL) and a local bit line (BL). The floating gate transistors 58 serve as non-volatile memory cells for storage of data in the NAND memory array 56, as previously discussed. As will be appreciated, each floating gate transistor 58 includes a source, a drain, a floating gate, and a control gate. The control gate of each floating gate transistor 58 is coupled to (and in at least some cases form) a respective local word line (WL). The floating gate transistors 58 are connected in series, source to drain, to form a NAND string 60 formed between select gates. Specifically, the NAND strings 60 are formed between the local drain select gate 62 and the local source select gate 64. A local drain select line (SGD) is coupled to a respective drain select gate 62. Similarly, the local source select line (SGS) is coupled to each NAND string 60 through a respective source select gate 64. The local drain select line (SGD) and the local source select line (SGS) are respectively coupled to a global drain select line (GSGD) and a global source select line (GSGS) lines in a many-to-one relationship (depicted and discussed in further detail with regard to FIG. 4). The drain select gates 62 and the source select gates 64 may each comprise a field-effect transistor (FET), for instance. A column of the memory array 56 includes a NAND string 60 and the source select gate 64 and drain select gate 62 connected thereto. A row of the floating gate transistors 58 are those transistors commonly coupled to a given local access line, such as a local word line (WL).

The source of each source select gate 64 is connected to a common source line (SL). The drain of each source select gate 64 is coupled to the source of a floating gate transistor 58 in a respective NAND string 60. The gate of each source select gate 64 is coupled to the source select line (SGS).

The drain of each drain select gate 62 is connected to a respective local bit line (BL) for the corresponding NAND string 60. The source of each drain select gate 62 is connected to the drain of a floating gate transistor 58 of a respective NAND string 60. Accordingly, as illustrated in FIG. 3, each NAND sting 60 is coupled between a respective drain select gate 62 and source select gate 64. Further, each word line (WL) includes an access device, such as access transistor 65 that is configured to enable or disable each respective word lines (WL).

Figure 4:
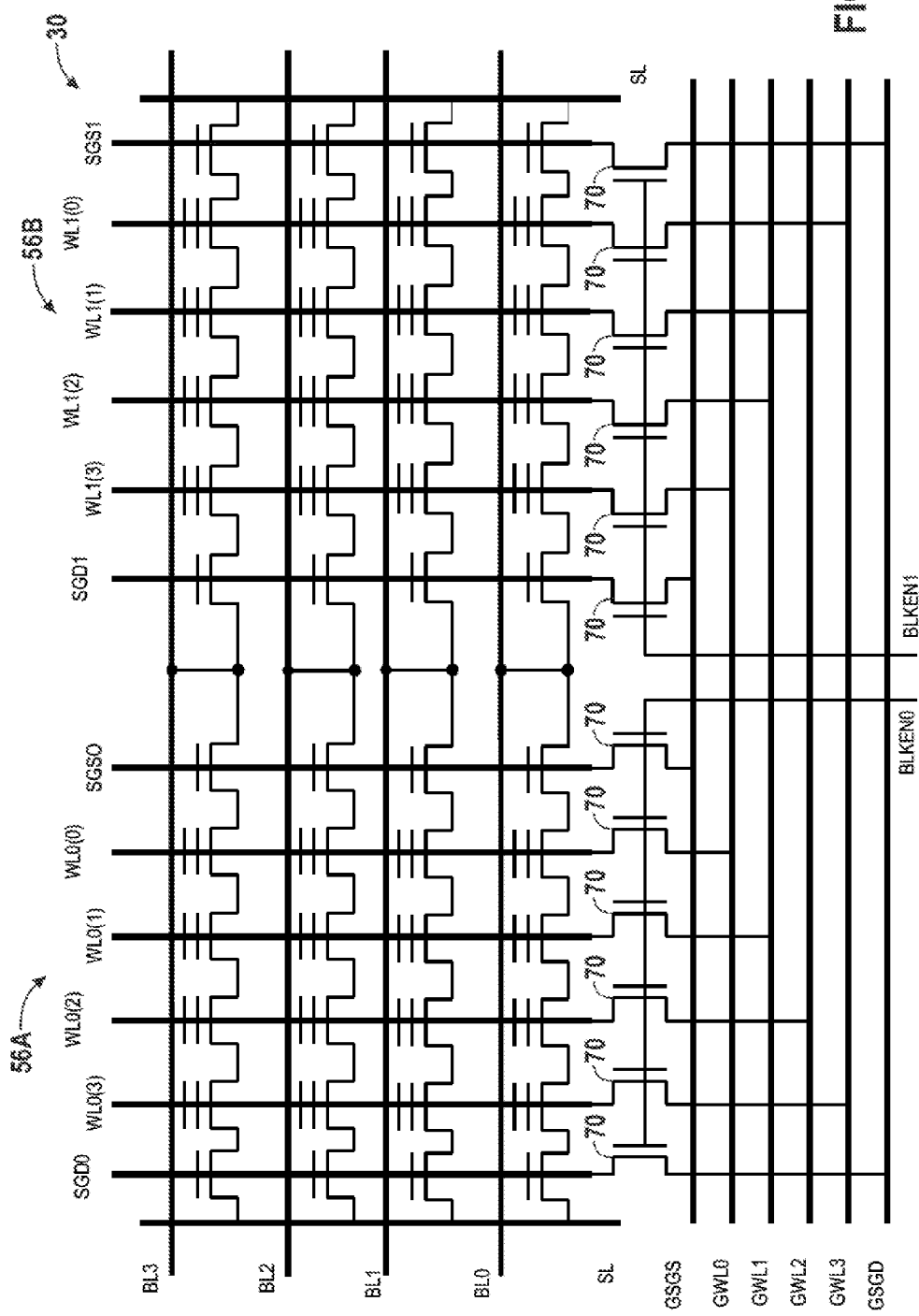
FIG. 4 is a schematic diagram of two blocks of NAND flash memory array (labeled prior art)

FIG. 4 illustrates an embodiment of the memory array 32 that includes a plurality of NAND memory arrays 56. In such an arrangement, each of the NAND memory arrays 56 may be referred to as a block. Accordingly, the illustrated embodiment includes two blocks 56A and 56B. In the illustrated embodiment, each block 56A and 56B includes four respective local word lines (WL0(0)-WL0(3) and WL1(0)-WL1(3)) and shares four local bit lines (BL0-BL3). However, as discussed above, other embodiments may include various numbers of word lines and bit lines. In other embodiments, any number of blocks 56 may be employed to form the memory array 32.

As discussed briefly above, each of the local word lines (WL0(0)-WL1(3)) are coupled to global word lines (GWL0-GWL3) via respective access transistors 70. Further, each of the local drain select line (SGD0 and SGD1) and the local source select line (SGS0 and SGS 1) are respectively coupled to a global drain select line (GSGD) and a global source select line (GSGS) via respective access transistors 70. Although not depicted, the local bit lines (BL0-BL3) are coupled to global bit lines in a similar manner, in some embodiments.

The access transistors 70 can be employed to couple the local lines to the global lines as desired. For example, block enable lines (BLKEN0 and BLKEN1) are coupled to gates of the access transistors 70. The block enable lines (BLKEN0 and BLKEN1) can be enabled and/or disabled to connect the local lines to the respective global lines. Where the access transistors 70 are configured to couple (e.g., connect) the local lines to global lines, the access transistors 70 may be said to be "selected." Where the access transistors 70 are configured to uncouple (e.g., disconnect) the local lines the global lines, the access transistors 70 may be said to be "deselected." Each access transistor 70 includes a high-voltage transistor (HVT) in one embodiment. A high-voltage transistor (HVT) may include a transistor that is configured to pass high voltages (e.g., more than about 18 volts). In some embodiments, the access transistors 70 may include n-type mosfets. However, in other embodiments, the access transistors 70 may include p-type mosfets.

In operation, typically, one block 56 is selected at a time. For example where block 56A is selected for a read, program and/or erase operation, the block enable lines (BLKEN0) are configured to select the access transistors 70 coupled to the respective local and global lines. However, in such an embodiment, the block enable lines (BLKEN1) to the deselected block(s) 56B are configured to un-select the respective access transistors 70 coupled to the deselected block(s) 56B, thereby un-selecting the block 56B. In operation, it is desired that the access transistors 70 coupled to the deselected block(s) 56B uncouple the global lines from the local lines, thereby enabling all or the majority of the voltage on the global lines to be delivered at the local lines of the selected block 56A. Unfortunately, a current (e.g., a leakage current) may flow across the access transistors 70 in the deselected state.

Figure 5:
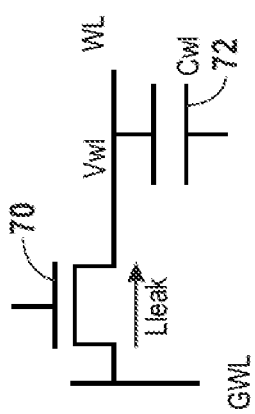
FIG. 5 is a schematic diagram of transistor and a leakage current path in accordance with one or more embodiments of the present invention.

For example, as depicted in FIG. 5, where a block 56 is deselected, a leakage current (Lleak) may flow across one or more of the access transistors 70 from a global word line (GWL) to a local word line (WL) having a word line voltage (Vwl). A word line (e.g., parasitic) capacitance (Cwl) is represented in the schematic by a capacitor 72 coupled to the word line (WL). Although the leakage current may not be significant through each individual access transistor 70, in a circuit that includes 1000 or more blocks (e.g., 1 selected block and 999 deselected blocks) the voltage level on the global lines may drop significantly due to the combined leakage current. For example, where a global word line (GWL) is biased to 18V (e.g., during a program operation) the combined leakage current (Lleak) may draw the voltage level down to 10V. To account for the leakage current (Lleak), the biasing voltage for the program operation may be set to a higher value. Unfortunately, scaling of an HVT (e.g., the access transistor 70) may be limited at higher voltages. For example, the gate oxide thickness may not be reduced below a threshold thickness and/or the channel length may not be reduced below a threshold length to accommodate the higher biasing voltage.

Accordingly, one or more embodiments of the present technique comprise biasing one or more of the local lines to a voltage level other than the negative voltage supply (e.g., 0V). By biasing (e.g., pre-charging) the local lines, a voltage may remain on the local lines when the respective access transistors 70 are deselected, thereby reducing the leakage current (Lleak) across the access transistor 70. As a result, the actual biasing voltage for each operation may be reduced, thereby enabling further scaling of the memory array 32. It is noted that, as used herein, the term "biasing" may refer to bringing a line up to the biasing voltage, whereas "pre-charging" may refer to transferring charge to a line to bring the line up to the biasing voltage as a result of the biasing.

Figure 6:
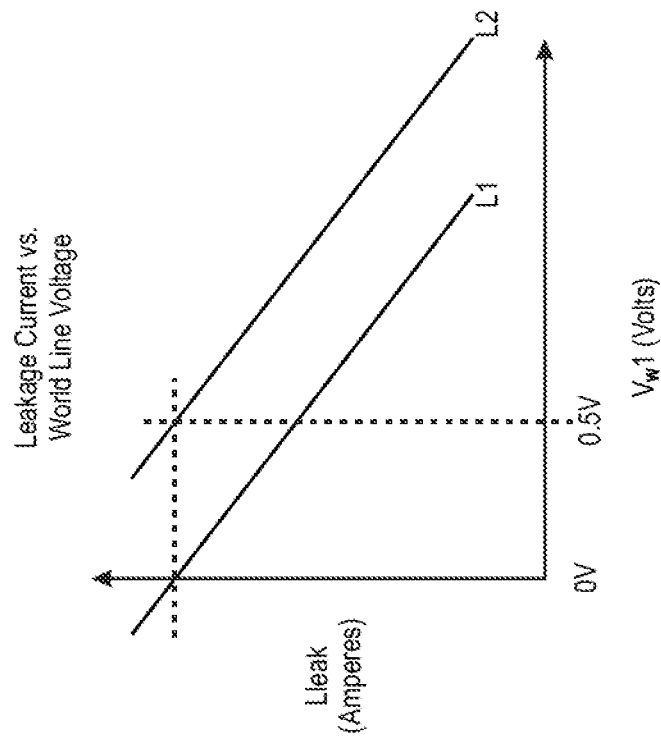
FIG. 6 is a plot that illustrates a relationship between the leakage current and a word line voltage in accordance with one or more embodiments of the present invention.

FIG. 6 is a plot that illustrates leakage current (Lleak) versus a voltage on a word line (e.g., a word line voltage (Vwl)). More specifically, the plot includes curves (L1 and L2) representative of the leakage current (Lleak) versus word line voltage (Vwl) for respective transistor devices having a long channel length and a short channel length. As illustrated in the plot, the leakage current (Lleak) may decrease as the word line voltage increases. Further the plot illustrates that the leakage current is higher for a transistor device (e.g., L2) having a short channel length. Accordingly, in one or more embodiments, the word line voltage (Vwl) is increased (e.g., to 0.5V) such that a short channel length transistor can be employed having a leakage current that is about the same or less than the leakage current of transistor having a long channel length. Achieving a word line voltage (Vwl) may be achieved in a variety of manners, as discussed in greater detail below.

FIG. 7 is a Table 1 that depicts a biasing scheme in accordance with one or more embodiments of the present technique. More specifically, Table 1 depicts voltage levels for each of the block enable lines (BLKEN0 and BLKEN1), the local bit lines (BL0 and BL1), the common source line (SL), the global source select line (GSGS), the global word lines (GWL0 and GWL1), the global drain select line (GSGD), the local source select lines (SGS0 and SGS1), the local word lines (WL0(0), WL0(1), WL1(0), and WL1(1)), the drain select lines (SGD0 and SGD1). Further, Table 1 depicts the respective voltage levels for operation (e.g., read, program, and erase) and for a stand-by state, as described below.

Figure 8A:
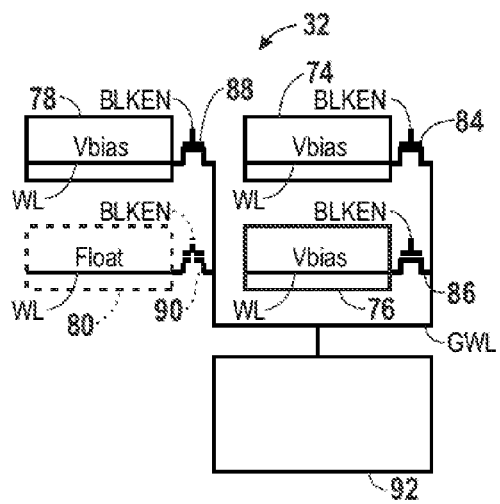
FIG. 8A is a schematic diagram of a memory array in a stand-by state in accordance with the table of FIG. 7 and one or more other embodiments of the present invention.
Figure 8B:
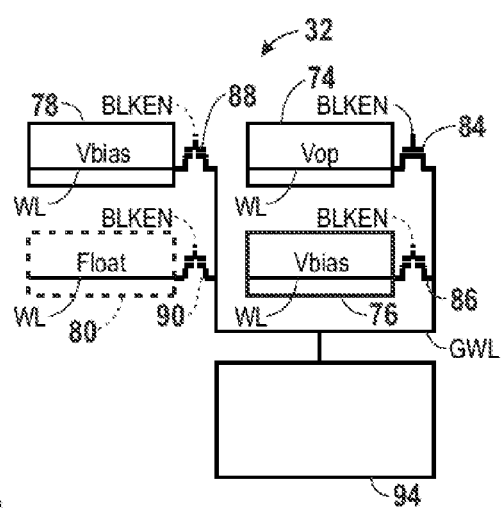
FIG. 8B is a schematic diagram of a memory array in an operation state in accordance with the table of FIG. 7 and one or more other embodiments of the present invention.
Figure 8C:
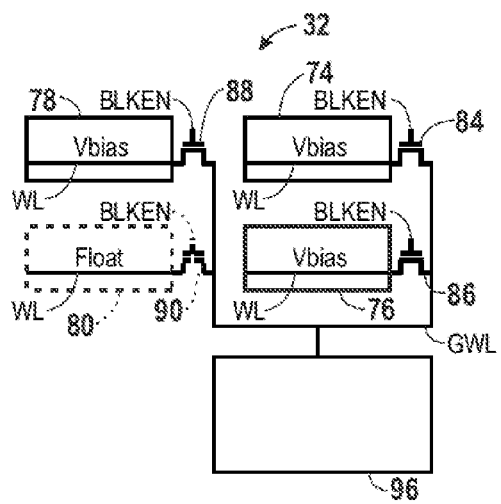
FIG. 8C is a schematic diagram of a memory array in a reset state in accordance with one the table of FIG. 7 and one or more other embodiments of the present invention.

In the depicted embodiment, in the stand-by state, the local word lines (WL0(0), WL0(1), WL1(0), and WL1(1)) and other lines are biased (e.g., pre-charged) to a voltage level that is above a ground voltage level (e.g., 0V). Embodiments of the memory array 32 that are configured to implement the biasing scheme of Table 1 are illustrated in FIGS. 8A-8C. In the illustrated embodiments of FIGS. 8A-8C, the memory array 32 and its associated operation is configured to include pre-charging the word lines in the stand-by state, deselecting or selecting the word lines in an operation state, biasing the word lines in a reset state, and returning to the stand-by state.

FIG. 8A is a schematic diagram that depicts the memory array 32 in one embodiment of the stand-by state. In the illustrated embodiment, the memory array 32 includes four blocks 74, 76, 78, and 80. One of the blocks 80 includes a bad block 74 (e.g., a block that has failed and is no longer in use). Each of the blocks 72-80 are coupled to a global word line (GWL) via respective access transistors 84, 86, 88, and 90. In the illustrated embodiment, each of the access transistors 84-90 are representative of the plurality of access transistors 70 associated with one block 56 depicted in FIG. 4. Accordingly, the selection and/or deselection of the access transistors 84-90 may be controlled by block enable signals (BLKEN) that are provided to the gates of the access transistors 84-90. Further, the global word line (GWL) is coupled to a bias voltage generator 92 that outputs a bias voltage (Vbias). In the illustrated embodiment, all blocks 74-78, except for the bad block 80, are selected. In this embodiment of the stand-by state, the local word lines (WL) of each of the selected blocks 74-78 are pre-charged to a bias voltage (Vbias) through the global word lines (GWL) and the respective selected access transistor 84-88.

In accordance with the embodiment of Table 1, the bias voltage (Vbias) is approximately 0.5V. However, in other embodiments, the bias voltage (Vbias) may be any voltage level that helps to reduce the leakage current across the access transistors 84-88 during an operation state. For example, in one embodiment, the bias voltage (Vbias) is a voltage above 0V (e.g., a range from 0.1V to 1V).

In one embodiment, as illustrated, the biasing voltage (Vbias) is provided via the bias voltage generator 92 coupled to the global word lines (GWL) and selected access transistors 84-88. To provide the bias voltage (Vbias), the bias voltage generator 92 may include a low-power generator configured to provide the biasing voltage (e.g., 0.5V), for example. Embodiments of the bias voltage generator 92 are discussed in greater detail below with regard to FIGS. 13A-13B.

Following the stand-by state, the memory array 32 is configured in an operation state. In one embodiment of the operation state, all of the blocks are deselected except one selected block. For example, as illustrated in FIG. 8B, three of the blocks 76-80 are disconnected from the global word line (GWL) via deselection of their respective access transistors 86-90, and one of the blocks 74 (e.g., the selected block) is connected to the global word line (GWL) via selection of its respective access transistor 84. In the operation state, memory operations (e.g., read, program, and/or erase) are conducted. For example, in one embodiment an operation voltage generator 94 is employed to provide the operation voltages for the read, program, and/or erase operations to the global word line (GWL). During the operations, an operation voltage (Vop) is applied to the global word line (GWL) via an operation voltage generator 94. However, the biasing voltage (Vbias) remains on the respective word lines (WL) of the deselected blocks 76-80. Thus, the biasing voltage (Vbias) may reduce the leakage current (Lleak) across the deselected access transistors 86-90 during the operations. For example, a bias voltage (Vbias) of 0.5V in accordance with Table 1 may reduce the leakage current, as discussed with regard to the plot of FIG. 6.

After the operation state, and before returning to the stand-by state, the memory array 32 is configured in a reset state, in one embodiment. For example, as illustrated in FIG. 8C, all blocks 74-78 except for the bad block 80 are selected in a manner similar to that of the stand-by state. In other words, each of the local word lines (WL) of each of the selected blocks 74-78 are biased (e.g., pre-charged) to the bias voltage (Vbias) through the global word lines (GWL) and the respective selected access transistor 84-88. In one embodiment, as illustrated, the biasing voltage (Vbias) is provided via a reset voltage generator 96 coupled to the global word lines (GWL). In one embodiment, the reset voltage generator 96 may include a high-power generator configured to provide the biasing voltage (e.g., 0.5V), for example. Embodiments of the reset voltage generator 96 are discussed in greater detail below with regard to FIGS. 13A-13B.

After the reset state and/or the operations state, the memory array 32 is re-configured to the stand-by state. Accordingly, the memory array 32 may include a configuration that is similar to that discussed above with regard to FIG. 8A. From the stand-by state, the memory array can be cycled through a similar routine of stand-by states, operation states and reset states to perform numerous operations. Further, it is noted that one or more of the configurations may be modified to provide a desired operation or function. For example, the level of the bias voltage (Vbias) may be modified and/or the reset state may be eliminated from the biasing scheme.

FIG. 9 includes a Table 2 that depicts another biasing scheme in accordance with one or more embodiments of the present technique. Similar to the Table 1, the Table 2 depicts voltage levels for each of the block enable lines (BLKEN0 and BLKEN1), the local bit lines (BL0 and BL1), the common source line (SL), the global source select line (GSGS), the global word lines (GWL0 and GWL1), the global drain select line (GSGD), the local source select lines (SGS0 and SGS1), the local word lines (WL0(0), WL0(1), WL1(0), and WL1(1)), the drain select lines (SGD0 and SGD1), and depicts the respective voltage levels for a stand-by state, an active state and an operation states (e.g., read, program, and erase states).

Figure 10A:
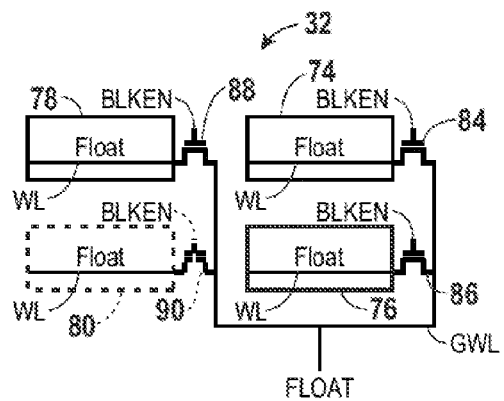
FIG. 10A is a schematic diagram of a memory array in a stand-by state in accordance with the table of FIG. 9 and one or more other embodiments of the present invention.
Figure 10B:
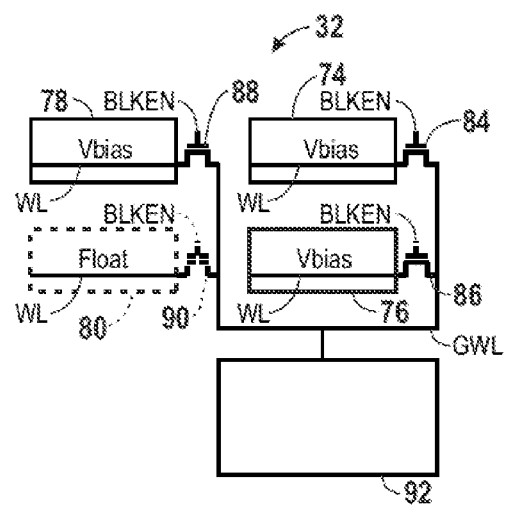
FIG. 10B is a schematic diagram of a memory array in an active state in accordance with the table of FIG. 9 and one or more other embodiments of the present invention.
Figure 10C:
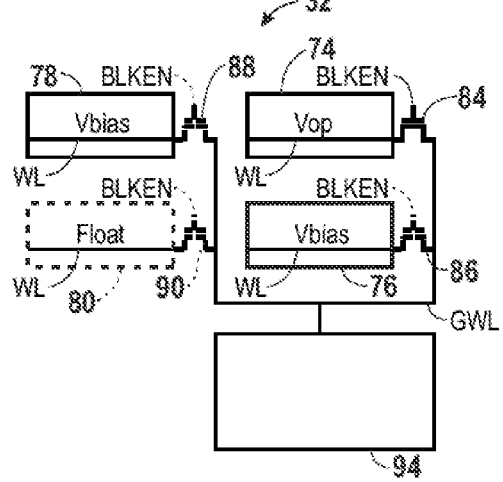
FIG. 10C is a schematic diagram of a memory array in an operation state in accordance with the table of FIG. 9 and one or more other embodiments of the present invention.

In the depicted embodiment of the stand-by state, all of the lines, except the word lines, are biased to 0V (e.g., ground). The local word lines (WL0(0), WL0(1), WL1(0), and WL1(1)) are not biased, but are instead floating. In the depicted embodiment of the active state, the word lines (WL0(0), WL0(1), WL1(0), and WL1(1)) and other lines are biased (e.g., pre-charged) to a bias voltage (Vbias) that is above the ground voltage (e.g., 0V). More specifically, the bias voltage is 0.5V. During the operations, each of the respective signals are biased to an appropriate voltage level or left floating. Embodiments of the memory array 32 that are configured to implement the biasing scheme of Table 2 are illustrated in FIGS. 10A-10C. In the illustrated embodiments, the memory array 32 and associated operations are configured to float the word lines in a stand-by state, bias the word lines and other line in an active state, deselect or select word lines in an operation state, bias the word lines again in a second active state, and return the memory array 32 into the stand-by state including, once again, floating the word lines.

FIG. 10A is a schematic diagram that depicts the memory array 32 in one embodiment of the stand-by state. Similar to the previous discussion, in the illustrated embodiment, the memory array 32 includes the four blocks 74-80. One of the blocks 80 includes a bad block (e.g., a block that has failed and is no longer in use). Each of the blocks 74-80 are coupled to the global word line (GWL) via their respective access transistors 84-90. In the stand-by state of FIG. 10A, the global word line (GWL) is floating. In other words, the global word line (GWL) is not biased to a voltage level. In the illustrated embodiment, all blocks 74-78 except for the bad block 80 are selected. The respective word lines (WL) of the selected blocks 74-78 are not biased, but are instead floating in the stand-by state.

Following the stand-by state, the memory array 32 is configured in the active state. Similar to the stand-by state discussed with regard to FIG. 8A, the active state includes biasing the word lines (WL) of the selected blocks 74-78 to the bias voltage (Vbias). In the active state, all of the blocks 74-78, except for the bad block 80, are selected. However, the global word line (GWL) is connected to the bias voltage generator 92 (e.g., a low-power generator). Accordingly, in the active state, the local word lines (WL) of each of the selected blocks 74-78 are pre-charged to the bias voltage (Vbias) through the global word lines (GWL) and the respective selected access transistor 84-88. In accordance with the embodiment of Table 2, the bias voltage (Vbias) is approximately 0.5V. However, as discussed previously with regard to FIG. 8A, the bias voltage (Vbias) may include other voltage levels in some embodiments. In one embodiment, as illustrated, the biasing voltage is provided via the bias voltage generator 92 coupled to the global word lines (GWL0 and GWL1) and selected access transistors 84-88.

Following the active state, the memory array 32 is configured in an operation state. In one embodiment, the operation state is similar to the operation state previously discussed with regard to FIG. 8B. For example, as illustrated in FIG. 10C, three of the blocks 76-80 are disconnected from the global word line (GWL) via deselection of their respective access transistors 86-90, and one of the blocks 74 (e.g., the selected block) is connected to the global word line (GWL) via selection of its respective access transistor 84. In the operation state, memory operations (e.g., read, program, and/or erase operations) are conducted. During the operations, an operation voltage (Vop) is applied to the global word line (GWL) and the word line (WL) of the selected block 74 via the operation voltage generator 94. However, the biasing voltage (Vbias) remains on the respective word lines (WL) of the deselected blocks 76-78. Thus, the biasing voltage (Vbias) may reduce the leakage current (Lleak) across the deselected access transistors 86-90 during the operations.

After the operation state, and before returning to the stand-by state, the memory array 32 is configured in the active state, in one embodiment. For example, in one embodiment, the memory array 32 is configured in the active state to bias the word lines (WL) to bias voltage (Vbias) as discussed with regard to FIG. 10B, in one embodiment. Finally, the memory array 32 is returned to the stand-by state. For example, in one embodiment, the memory array 32 is configured in the stand-by state to float the word lines (WL) as discussed above with regard to FIG. 10A. From the stand-by state, the memory array can be cycled through a similar routine of stand-by states, active states and operation states. Further, it is noted that one or more of the configurations may be modified to provide a desired operation or function. For example, the bias voltage may be modified and/or the active state after the operations state may be eliminated from the biasing scheme.

FIG. 11 is a Table 3 that depicts yet another biasing scheme, in accordance with one or more embodiments of the present technique. Similar to the Table 1 and the Table 2, the Table 3 depicts voltage levels for each of the block enable lines (BLKEN0 and BLKEN1), the local bit lines (BL0 and BL1), the common source line (SL), the global source select line (GSGS), the global word lines (GWL0 and GWL1), the global drain select line (GSGD), the local source select lines (SGS0 and SGS1), the local word lines (WL0(0), WL0(1), WL1(0), and WL1(1)), the drain select lines (SGD0 and SGD1), and depicts the respective voltage levels for a stand-by state and an active state and operation states (e.g., read, program, and erase states).

Figure 12:
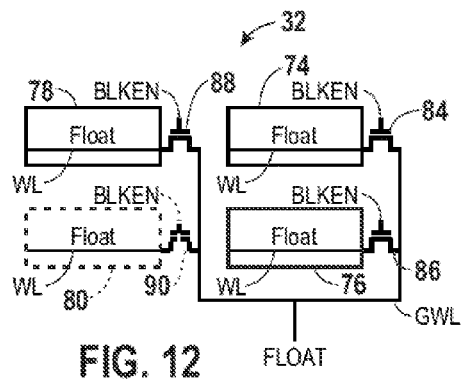
FIG. 12 is a schematic diagram of a memory array in a stand-by state in accordance with the table of FIG. 11 and one or more other embodiments of the present invention.

In contrast to the embodiment of the Table 2, in the depicted embodiment, in the stand-by state, all of the lines, including the local word lines (WL0(0), WL0(1), WL1(0), and WL1(1)), are biased to 0V (e.g., ground). Similar to the embodiment of Table 2, in the depicted embodiment of the active state, the word lines (WL0(0), WL0(1), WL1(0), and WL1(1)) and other lines are biased (e.g., pre-charged) to a bias voltage (Vbias) that is above the ground voltage (e.g., 0V). More specifically, the bias voltage is 0.5V. During the operations, each of the respective signals are biased to an appropriate voltage level or left floating. An embodiment of the memory array 32 that is configured to implement the biasing scheme of Table 3 is illustrated in FIG. 12. In one embodiment, the memory array 32 and associated operations are configured to ground the word lines in a stand-by state, bias the word lines and other line in an active state, deselecting or selecting word lines in an operation state, bias the word lines again in a second active state, and return the memory array 32 into the stand-by state including, once again, grounding the word lines.

FIG. 12 is a schematic diagram that depicts the memory array 32 in one embodiment of the stand-by state. Similar to the previous discussion, in the illustrated embodiment, the memory array 32 includes the four blocks 74-80. One of the blocks 80 includes a bad block (e.g., a block that has failed and is no longer in use). Each of the blocks 74-80 are coupled to the global word line (GWL) via their respective access transistors 84-90. In the stand-by state of FIG. 12, the global word line (GWL) is grounded. In other words, the global word line (GWL) is biased to ground (e.g., 0V). In the illustrated embodiment, all blocks 74-78, except for the bad block 80, are selected. Accordingly, the respective word lines (WL) of the selected blocks 74-78 are also biased to ground.

Following the stand-by state, the memory array 32 is configured in the active state, the operation state, and the active state before the memory array 32 is returned to the stand-by state. In one embodiment, the active state includes the same or a similar configuration to that discussed with regard to FIG. 10B. Accordingly, the active state includes biasing the word lines (WL) of the selected blocks 74-78 to the bias voltage (Vbias), in one embodiment. In one embodiment, the operation state includes the same or a similar configuration to that discussed with regard to FIGS. 8B and 10C. Accordingly, the operation state includes the operation voltage (Vop) applied to the global word line (GWL) via the operation voltage generator 94, and the biasing voltage (Vbias) remaining on the respective word lines (WL) of the deselected blocks 78-76, in one embodiment. Similar to the previous discussions, it is noted that one or more of the configurations may be modified to provide a desired operation or function. For example, the bias voltage level (Vbias) may be modified and/or the active state after the operations state may be eliminated from the biasing scheme.

In accordance with certain techniques of the prior art, flash memory can operate in a single plane or a dual plane configuration. When operating in a single plane configuration, generally one plane is selected and configured in an active state and the deselected plane is configured in a standby state. In such a configuration, the word lines (WL) and bit lines (BL) are grounded or floated. When operating in a dual plane configuration, the word lines (WL) and bit lines (BL) are biased with a voltage. When operating in a single plane configuration, there may be a leakage current from the global word lines (GWL) to the word lines (WL). When operating in a dual plane configuration, there is generally not a leakage current from the global word lines (GWL) to the word lines (WL) because there is an increased voltage on the bit lines (BL) and the word lines (WL) via coupling capacitance between the bit lines (BL) and the word lines (WL). Certain embodiments of the present technique may provide for reducing the leakage current when operating in a single plane configuration or a dual plane configuration. For example, in accordance with at least one embodiment of the present technique, the bit lines (BL) of the deselected plane and the selected plane are pre-charged, and the word lines (WL) may remain floating.

Figure 13A:
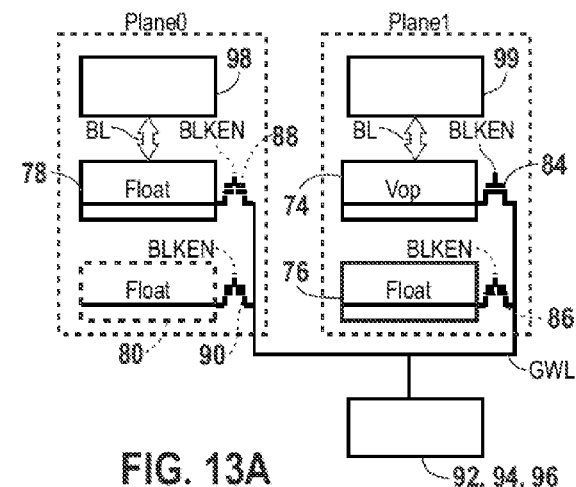
FIGS. 13A-13B are schematic diagrams of a memory array having a dual pane configuration in accordance with one or more other embodiments of the present invention.
Figure 13B:
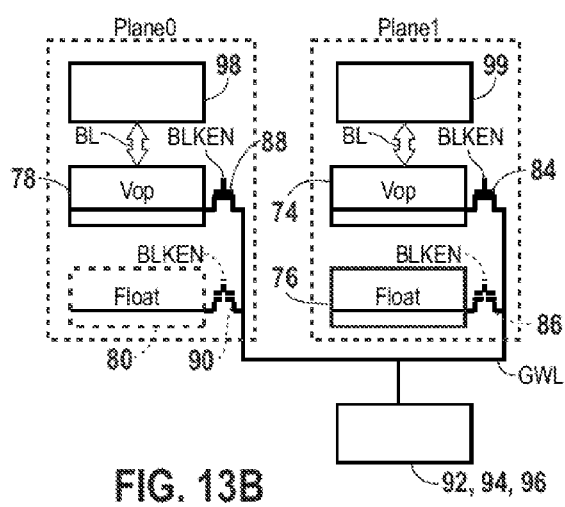

FIGS. 13A and 13B are schematic diagrams that depict the memory array 32 in accordance with one or more embodiments of the present technique. In the illustrated embodiment, the memory array 32 includes the four blocks 74-80 that are contained in two planes plane0 and Plane 1. Each plane plane0 and plane1 includes a bit-line control circuit 98 and 99, respectively. The bit-line control circuits 98 and 99 are each coupled to the blocks 74-80 via bit lines (BL). FIG. 13A illustrates an embodiment of the memory array 32 that includes a single plane configuration (e.g., one plane plane0 is deselected and another plane plane1 is selected). As previously discussed, where the memory array 32 is configured in such a single plane configuration, one technique of the prior art may include the bit lines (BL) of the deselected plane plane0 floated or grounded and the bit lines (BL) of the selected plane Plane1 biased to an operational voltage (e.g., an operational voltage that is different from the operational voltage (Vop) at the selected block 74). However, in an embodiment of the present technique the bit lines (BL) of the selected plane plane1 and the deselected plane plane0 are both biased to a voltage (e.g., an operational voltage that is different from the operational voltage (Vop) at the selected block 74). As depicted in FIG. 13B, in one embodiment configured in a dual plane configuration, both planes plane0 are selected. In such an embodiment the bit lines (BL) of the selected plane plane1 and the deselected plane plane0 are biased to a voltage (e.g., an operational voltage that is different from the operational voltage (Vop) at the selected block 74). Accordingly, in both a single plane configuration and a dual plane configuration, the bit lines (BL) remain pre-charged, even while the word lines in a deselected plane remain floated. Such a technique may be extended to configurations that include more than two planes (e.g., four plane and eight planes configurations).

Figure 14A:
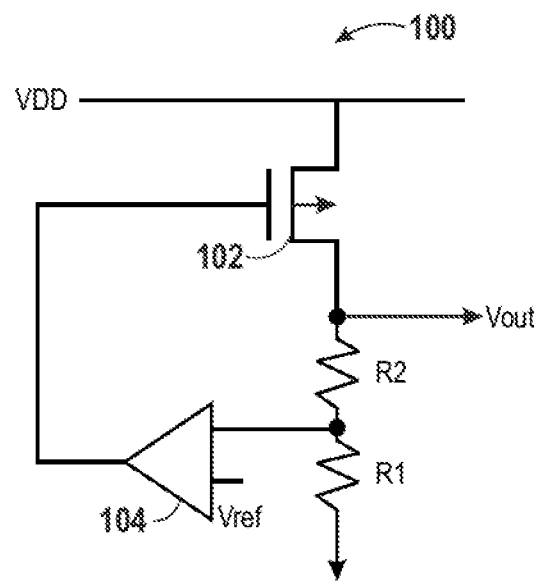
FIGS. 14A-14D are schematic diagrams of voltage generators in accordance with one or more embodiments of the present invention.

Turning now to FIGS. 14A-14D, embodiments of a voltage generator 100 (e.g., the bias voltage generator 92 and/or the reset voltage generator 96) are depicted. As depicted in FIG. 14A, one embodiment of the voltage generator 100 includes a transistor 102, resistors R1 and R2, and an opamp 104. In the illustrated embodiment, the transistor 102 includes a pmosfet coupled between a positive supply line (VDD) and a node coupled to an output (Vout). The output (Vout) is coupled to the global word line (GWL) to provide the bias voltage (Vbias), in one embodiment. An input of the opamp 104 is coupled to a node between the two resistors R1 and R2 which are in arranged in series between the node coupled to the output (Vout) and ground. Another input of the opamp is coupled to a reference voltage (Vref). In one embodiment, the reference voltage (Vref) is equal to the desired bias voltage (Vbias), for example 0.5V. An output of the opamp 104 is coupled to a gate of the transistor 102. In such an embodiment, a low-power voltage generator is provided when the resistor R1 has a high resistor value (e.g., about 100 k-ohm to about 1M-ohm), and a high-power voltage generator is provided when the resistor R1 has a low resistance value (e.g., about 10 k-ohm to about 100 k-ohm).

Figure 14B:
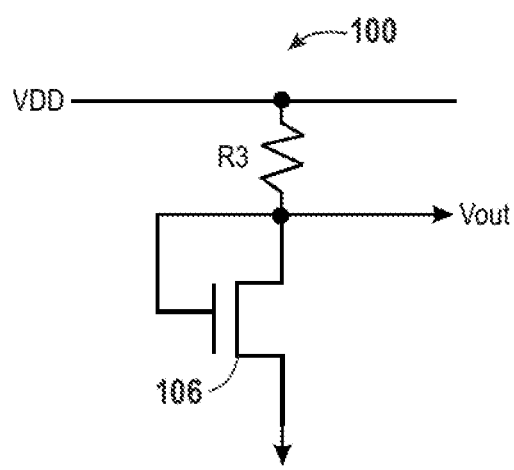

As depicted in FIG. 14B, another embodiment of the voltage generator 100 includes a transistor 106 and a resistor R3. In the illustrated embodiment, the resistor R3 is coupled in series with the transistor 102, and located between the transistor 106 and the positive supply line (VDD). In the illustrated embodiment the transistor 106 includes an nmosfet. An output (Vout) is coupled to a node between the resistor R3 and the transistor 106. The gate of the transistor is coupled the same node as the output (Vout). Similar to the previously discussed embodiment, in one embodiment, the output (Vout) is coupled to the global word line (GWL) to provide the bias voltage (Vbias). In such an embodiment, a low-power voltage generator is provided when the resistor R3 has a high resistor value (e.g., about 100 k-ohm to about 1M-ohm), and a high-power voltage generator is provided when the resistor R3 has a low resistance value (e.g., about 10 k-ohm to about 100 k-ohm).

Figure 14C:
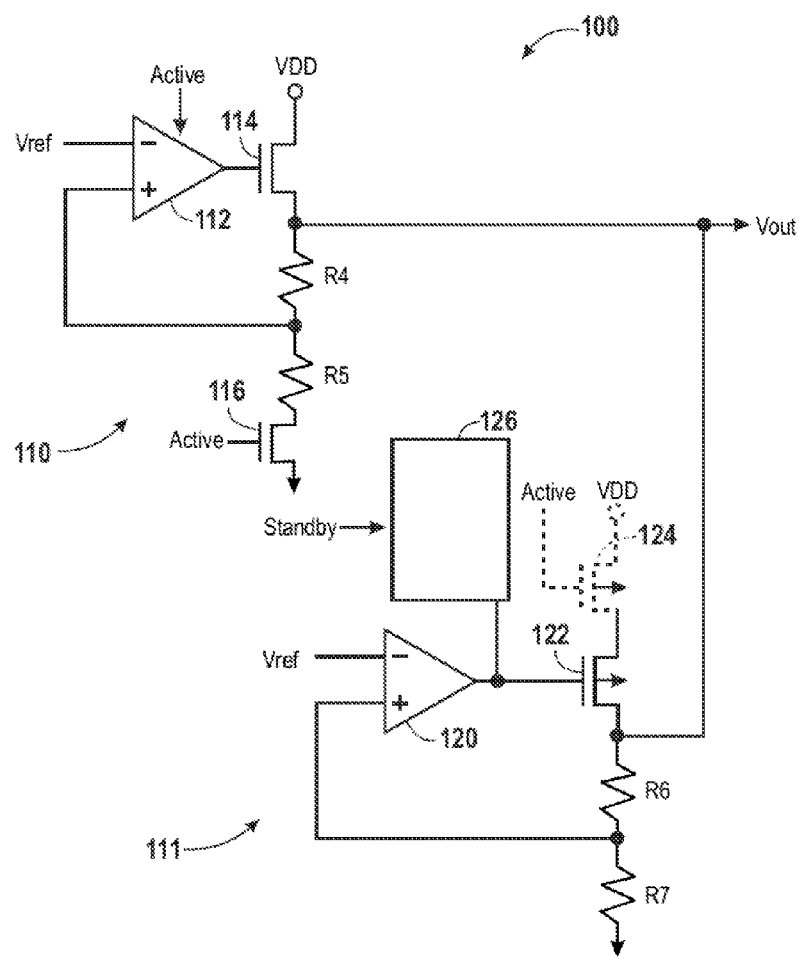

As depicted in FIG. 14C, another embodiment of the voltage generator 100 includes a high-power regulator (e.g., an active-power regulator) 110 and a low-power regulator (e.g., a standby-power regulator) 111 coupled to the output (Vout). The high-power regulator 110 includes an opamp 112, a first transistor 114, a second transistor 116, and two resistors R4 and R5. In the illustrated embodiment, the transistor 102 includes a pmosfet coupled between a positive supply (VDD) and a node coupled to an output (Vout). The two resistors R4 and R5 are coupled in series between the node coupled to the output (Vout) and the second transistor. In the illustrated embodiment the transistor 106 includes an nmosfet coupled to one of the resistors R5 and ground. The gate of the second transistor 116 is coupled to a control signal (active). In the illustrated embodiment, the positive input of the opamp 112 is coupled to a node between the two resistors R4 and R5, and the other input is coupled to a reference voltage (Vref). The control signal (active) is also input to the opamp 112 and an output of the opamp 112 is coupled to the gate of the first transistor 114.

The low-power regulator 111 includes an opamp 120, a third transistor 114, a fourth transistor 116, two resistors R6 and R7, and a pull-up circuit 126. In the illustrated embodiment, the third transistor 122 and the fourth transistor 124 include pmosfet devices. The fourth transistor 124 is coupled between the positive supply (VDD) and the third transistor 122, and the control signal (active) is coupled to the gate of the fourth transistor 124. The third transistor 122 is coupled between the fourth transistor 124 and a node coupled to an output (Vout). The two resistors R6 and R7 are coupled in series between the node coupled to the output (Vout) and ground. In the illustrated embodiment, the positive input of the opamp 120 is coupled to a node between the two resistors R6 and R7, and the other input is coupled to the reference voltage (Vref). An output of the opamp 112 is coupled to a node that is coupled to the gate of the third transistor 114. A fourth control signal (standby) is input to the pull-up circuit 126 and the output of the pull-up circuit 126 is also coupled the node that is coupled to the gate of the third transistor 122. In the illustrated circuit, when the first control signal (active) is high and the second control signal (standby) is low, the high-power regulator 110 drives the output (Vout) with high current. The pull-up circuit 126 works to keep the gate of the third transistor 122 constant, independent of the output of the opamp 120. When the first control signal (active) is low and the second control signal (standby) is high, the low-power regulator 111 drives the output (Vout) with low current. To help keep the output (Vout) stable during the transition between the high-power and low-power configurations, the resistance ration may be (R4/R5<R6/R7) or (R4/R5=R6/R7)).

Figure 14D:
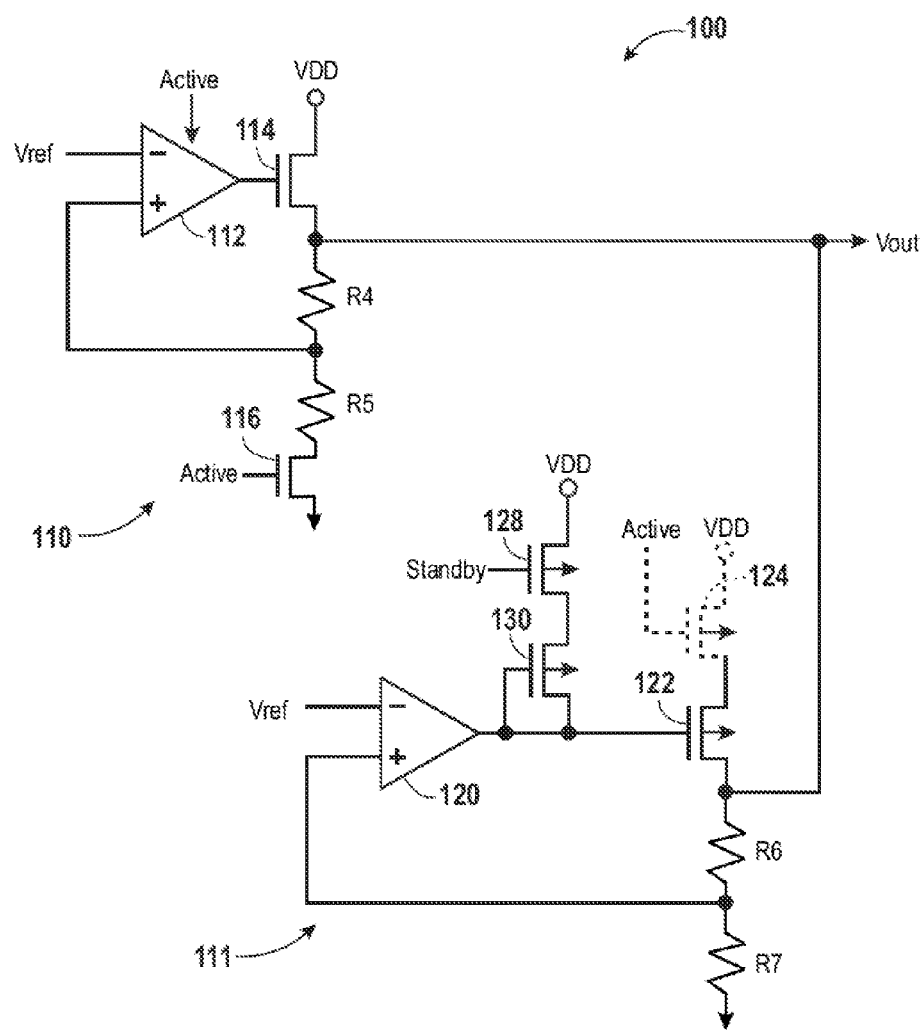

FIG. 14D illustrated another embodiment of the voltage generator 100. Similar to the embodiment of the voltage generator discussed with regard to FIG. 14C, the voltage generator 100 of FIG. 14D includes a high-power regulator (e.g., an active-power regulator) 110 and a low-power regulator (e.g., a standby-power regulator) 111 coupled to the output (Vout). However, the pull-up circuit 126 of FIG. 14D includes gate-drain transistors 128 and 130 that are coupled in series between the positive supply (VDD) and the node between the node that is coupled to the gate of the third transistor 122. The second control signal (standby) is coupled to the gate of the gate-drain transistor 128 coupled to the positive supply (VDD), and the output of the opamp 120 is coupled to the gate-drain transistor 130 coupled to the node between the node that is coupled to the gate of the third transistor 122. Such a configuration enables the third transistor 122 to operate smoothly after the low-power regulator 111 starts to operate.

Although the previously discussed embodiments include certain configurations of the memory array 32, the configuration of the memory array 32 may be varied to accommodate the previously discussed biasing scheme. For example, where the access transistors 70 comprise pmosfets, the bias voltage (Vbias) may include a voltage level that is below a negative supply voltage (Vss), such as a voltage level below 0V where Vss is grounded, as is conventional. In some embodiments, the bias voltage generator 92, the operation voltage generator 94, and the reset voltage generator 96 includes a charge pump or similar voltage source that are separate from one another. However, other embodiments include the bias voltage generator 92, the operation voltage generator 94, and/or the reset voltage generator 96 may be integrated into a single voltage source, such as a single voltage generator that provides the respective voltages. Further, although the previously discussed embodiments have focused on reducing leakage currents across the word lines, other embodiments may include application of the same or a similar technique to reduce the leakage current across other transistors in the memory array 32.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A memory device comprising:
   a plurality of memory cells;
   a plurality of local access lines, wherein each local access line of the plurality of local access lines is coupled to at least one memory cell of the plurality of memory cells;
   a global access line; and
   an access device configured to selectably couple the global access line to a selected local access line of the plurality of local access lines;
   wherein the memory device is configurable in a first state that comprises biasing the selected local access line to a voltage level other than a negative supply voltage of the memory device and a second state that comprises performing a memory operation, wherein the first state comprises a non-operational state, and wherein the memory operation comprises an erase operation comprising biasing the selected local access line to zero while unselected local access lines of the plurality of access lines are floating.

2. The memory device of claim 1, wherein the access device comprises a field-effect transistor.

3. The memory device of claim 2, wherein the access transistor comprises a high-voltage transistor.

4. The memory device of claim 2, wherein a gate of the access transistor is coupled to a block enable line configured to select or deselect a block of a memory array of the memory device.

5. The memory device of claim 1, wherein the memory device is configurable in a third state that comprises one or more local access lines of the plurality of local access lines biased to ground.

6. The memory device of claim 1, wherein the memory device is configurable in a third state that comprises one or more local access lines of the plurality of local access lines floating.

7. A method comprising:
   coupling a global access line of a memory to a first access line and a second access line of the memory to:
      float the first access line and the second access line during a stand-by state of the memory; and
      bias the first access line and the second access line to a non-zero voltage when the memory is not performing a memory operation and prior to performing an operation of the memory during an active state; and
   decoupling the global access line from the first access line such that voltage on the first access line is the non-zero voltage and voltage on the second access line is an operation voltage used to facilitate performing the operation of the memory during an operation state.

8. The method of claim 7, wherein biasing the first access line and the second access line to the non-zero voltage level comprises providing the non-zero voltage level to the global access line.

9. The method of claim 7, wherein coupling the global access line to the first access line comprises selecting an access transistor coupled between the global access line and the first access line.

10. The method of claim 7, wherein biasing the first access line comprises pre-charging the first access line to the non-zero voltage level.

11. The method of claim 7, wherein the non-zero voltage level is greater than a negative supply voltage.

12. The method of claim 7, wherein the non-zero voltage level is between 0.1 volts and 1.0 volts.

13. The method of claim 7, wherein the non-zero voltage level is approximately 0.5 volts.

14. A method comprising:

grounding a global access line when a memory device is in a stand-by state such that an access line, a select gate, or some combination thereof coupled to the global access line is grounded, wherein the memory device is not performing a memory operation while in the stand-by state;

biasing the global access line to a voltage level other than a negative supply voltage level of the memory device when the memory device is in an active state such that the access line, the select gate, or some combination thereof is biased to the voltage level, wherein the active state is after the stand-by state while the memory device is not performing a memory operation and prior to performing an operation of the memory device, wherein the voltage level is between 0.1 volts and 1.0 volts; and applying an operation voltage to the global access line to facilitate performing the operation of the memory device.

15. The method of claim 14, wherein the memory device is performing a memory operation while in a read state, a write state, or an erase state.

16. The method of claim 14, wherein biasing the access line, the select gate, or some combination thereof to the voltage level comprises coupling the global access line of the memory device to the access line of the memory device.

17. The method of claim 16, wherein biasing the access line, the select gate, or some combination thereof to the voltage level comprises providing the voltage level to the global access line while the global access line is coupled to the access line.

18. The method of claim 16, wherein coupling the global access line to the access line comprises selecting an access transistor coupled between the global access line and the access line.

19. The method of claim 14, wherein the voltage level is approximately 0.5 volts.

* * * * *